(12) United States Patent　　(10) Patent No.: US 7,556,913 B2
Furuse et al.　　(45) Date of Patent: Jul. 7, 2009

(54) METAL OR METAL COMPOUND PATTERN AND FORMING METHOD OF PATTERN, AND ELECTRON EMITTING DEVICE, ELECTRON SOURCE, AND IMAGE-FORMING APPARATUS USING THE PATTERN

(75) Inventors: Tsuyoshi Furuse, Kanagawa (JP); Masahiro Terada, Kanagawa (JP); Shosei Mori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 556 days.

(21) Appl. No.: 10/910,273

(22) Filed: Aug. 4, 2004

(65) Prior Publication Data

US 2005/0008955 A1　　Jan. 13, 2005

Related U.S. Application Data

(62) Division of application No. 10/122,344, filed on Apr. 16, 2002, now Pat. No. 6,833,224.

(30) Foreign Application Priority Data

Apr. 19, 2001　(JP)　　　.............................. 2001/121193
Apr. 11, 2002　(JP)　　　.............................. 2002/108791

(51) Int. Cl.
　　*G03F 7/00*　　(2006.01)
(52) U.S. Cl. .......................... 430/311; 430/322; 430/330
(58) Field of Classification Search ................. 430/311, 430/322, 12, 330
See application file for complete search history.

(56) References Cited

U.S. PATENT DOCUMENTS

| 5,543,263 | A | * | 8/1996 | Rahman et al. ............. 430/168 |
| 6,113,448 | A | | 9/2000 | Kobayashi et al. ............ 445/24 |
| 6,123,876 | A | * | 9/2000 | Kobayashi et al. ....... 252/519.2 |
| 6,586,155 | B2 | | 7/2003 | Furuse et al. ............ 430/270.1 |
| 2004/0087239 | A1 | * | 5/2004 | Shimoda et al. ............... 445/50 |

(Continued)

FOREIGN PATENT DOCUMENTS

CN　　　1103204 A　　5/1995

(Continued)

OTHER PUBLICATIONS

English Translation of Furuse, JP 2000-090820, Mar. 31, 2000.*

*Primary Examiner*—Mark F Huff
*Assistant Examiner*—Caleen O Sullivan
(74) *Attorney, Agent, or Firm*—Fitzpatrick, Cella, Harper & Scinto

(57) ABSTRACT

The present invention is to provide a method for forming various patterns such as a metal or metal compound pattern, in which the amounts of the materials constituting the pattern which are removed during the formation step can be suppressed to the minimum. The method comprises a resin pattern forming step of forming on the surface of a substrate a resin pattern capable of absorbing a solution containing metal components, an absorbing step of dipping the resin pattern in the solution containing metal components to make the resin pattern absorb the solution containing metal components, a washing step of washing the substrate having formed thereon the resin pattern that has absorbed the solution containing metal components, and a burning step of burning the resin pattern after washing.

7 Claims, 2 Drawing Sheets

U.S. PATENT DOCUMENTS

2005/0266589 A1 * 12/2005 Furuse et al. ............ 438/21

FOREIGN PATENT DOCUMENTS

| JP | 64-089425 | * | 4/1989 |
| JP | 03-100021 | * | 4/1991 |
| JP | 5-114504 | | 5/1993 |
| JP | 7-74445 | | 3/1995 |
| JP | 2527271 | | 6/1996 |
| JP | 09-106757 | | 4/1997 |
| JP | 9-213211 | | 8/1997 |
| JP | 11-12504 | | 1/1999 |
| JP | 2000-90820 | | 3/2000 |
| JP | 2000-129211 | | 5/2000 |
| JP | 2000-138319 | | 5/2000 |
| JP | 2000-243327 | | 9/2000 |
| KR | 1999-0086906 | | 12/1999 |

* cited by examiner

METAL OR METAL COMPOUND PATTERN AND FORMING METHOD OF PATTERN, AND ELECTRON EMITTING DEVICE, ELECTRON SOURCE, AND IMAGE-FORMING APPARATUS USING THE PATTERN

This application is a division of U.S. application Ser. No. 10/122,344, filed Apr. 16, 2002.

BACKGROUND OF THE INVENTION

1. Field of the Invention

The present invention relates to a method for forming a metal or metal compound pattern by using a solution containing metal components, and a method for manufacturing an electron emitting device, an electron source and an image-forming apparatus using the pattern. The present invention also relates to a metal or metal compound pattern using a desired porosity; and an electron emitting device, an electron source and an image-forming apparatus using the pattern.

2. Related Background Art

With respect to a method for forming an electrically conductive pattern used as an electrode, a wiring and the like, conventionally known are the following methods: (1) a method of adhering a metal by a sputtering method (by a sputtering), patterning a resist and performing etching by an ion-milling method to peel a resist; (2) a method of printing an electrically conductive paste to a desired pattern using a screen printing, and then drying/baking it to form a desired electrically conductive pattern; (3) a method of forming an electrically conductive pattern by transfer; (4) a method of coating an electrically conductive paste over the entire surface of a substrate, drying/baking it to form a metal film, covering a desired part of the metal film with a mask such as photo resist and etching the parts other than the desired parts to form a desired electrically conductive pattern; (5) a method of imparting the photosensitivity to a metal paste, exposing a desired part thereof and then developing it to form an electrically conductive pattern (Japanese Patent Application Laid-open No. 5-114504); and (6) a method of allowing a layer formed of gelatin or the like to absorb droplets having electroconductivity and burning-removing the gelatin layer to form an electroconductive film (Japanese Patent Application Laid-open No. 9-213211).

However, the method (4) and the method (5) have a problem in that, particularly in a case of constituting an electrically conductive pattern by a noble metal such as platinum, a large amount of noble metal components are removed at the time of etching and development, which results in much labor and a heavy burden in terms of equipment required for recovering and reusing the components removed. Also, there arises the above-described problem not only in the formation of an electrically conductive pattern but also in the formation of a metal compound pattern including insulating materials. Accordingly, a solution for this problem has been demanded.

With respect to the quality of the formed pattern, the film pattern formed according to the method (1) has high film density and electrode properties of the pattern itself have no problem. However, it has a problem that in the presence of dissimilar metals, the properties thereof change with the passage of time because dissimilar metals easily diffuse and move. Further, in the electron emitting device, the diffusion of dissimilar metals may adversely affect the electron emitting property, which is regarded as a problem (Japanese Patent Application Laid-open No. 2000-243327). Further, the film patterns formed according to the methods (2) to (5) have low film densities and it is difficult to stably control the film quality. Therefore, for example, when a plurality of patterns are formed on a substrate, there arises a problem that uneven distribution takes place with respect to the electrical properties.

In particular, according to the method (2), it was difficult to form a fine pattern. According to the method (3), it was difficult to form a pattern having a uniform film quality or to form a pattern having reproducibility.

SUMMARY OF THE INVENTION

The present invention has been made by taking account of these problems inherent in conventional techniques and the object of the present invention is to provide a method for forming various patterns such as a metal or metal compound pattern, in which the amounts of the materials constituting the pattern which are removed during the formation step can be suppressed to the minimum, and in particular, even when a pattern is constituted by a noble metal such as platinum, the materials constituting the pattern which are removed during the formation step can be recovered and reused at the minimum load.

Another object of the present invention is to provide a metal or metal compound pattern, in particular, preferably an electrode pattern, in which the stability of properties as a metal or metal compound pattern are maintained and at the same time, the diffusion and movement of dissimilar metals in the presence of dissimilar metals is suppressed.

According to the present invention, there is provided a method of manufacturing a metal or metal compound pattern, the method comprising: a resin pattern forming step of forming on the surface of a substrate a resin pattern capable of absorbing a solution containing metal components; an absorbing step of dipping the resin pattern in the solution containing metal components to make the resin pattern absorb the solution containing metal components; a washing step of washing the substrate having formed thereon the resin pattern that has absorbed the solution containing metal components; and a burning step of burning the resin pattern after washing.

Further, according to the present invention, there is provided a method of manufacturing a metal or metal compound pattern, the method comprising: a resin pattern forming step of forming on the surface of a substrate a resin pattern capable of absorbing a solution containing metal components; an absorbing step of coating the solution containing metal components onto the resin pattern by a spray method or a spin coat method to make the resin pattern absorb the solution containing metal components; a washing step of washing the substrate having formed thereon the resin pattern that has absorbed the solution containing metal components; and a burning step of burning the resin pattern after washing.

Still further, according to the present invention, there is provided a method of manufacturing a metal or metal compound, the method comprising: a resin pattern forming step of forming on the surface of a substrate a resin pattern capable of absorbing a solution containing metal components and capable of ion-exchanging the metal components; an absorbing step of making the resin pattern absorb the solution containing metal components; and a burning step of burning the resin pattern that has absorbed the solution containing metal components.

Further, according to another aspect of the present invention, there is provided a pattern comprising: a first region having a first metal or a first metal compound and having a porosity of 60% or less; and a second region disposed so as to be in contact with the first region and having a second metal or a second metal compound which is different from the first metal or the first metal compound.

DESCRIPTION OF THE PREFERRED EMBODIMENTS

Figure 1:
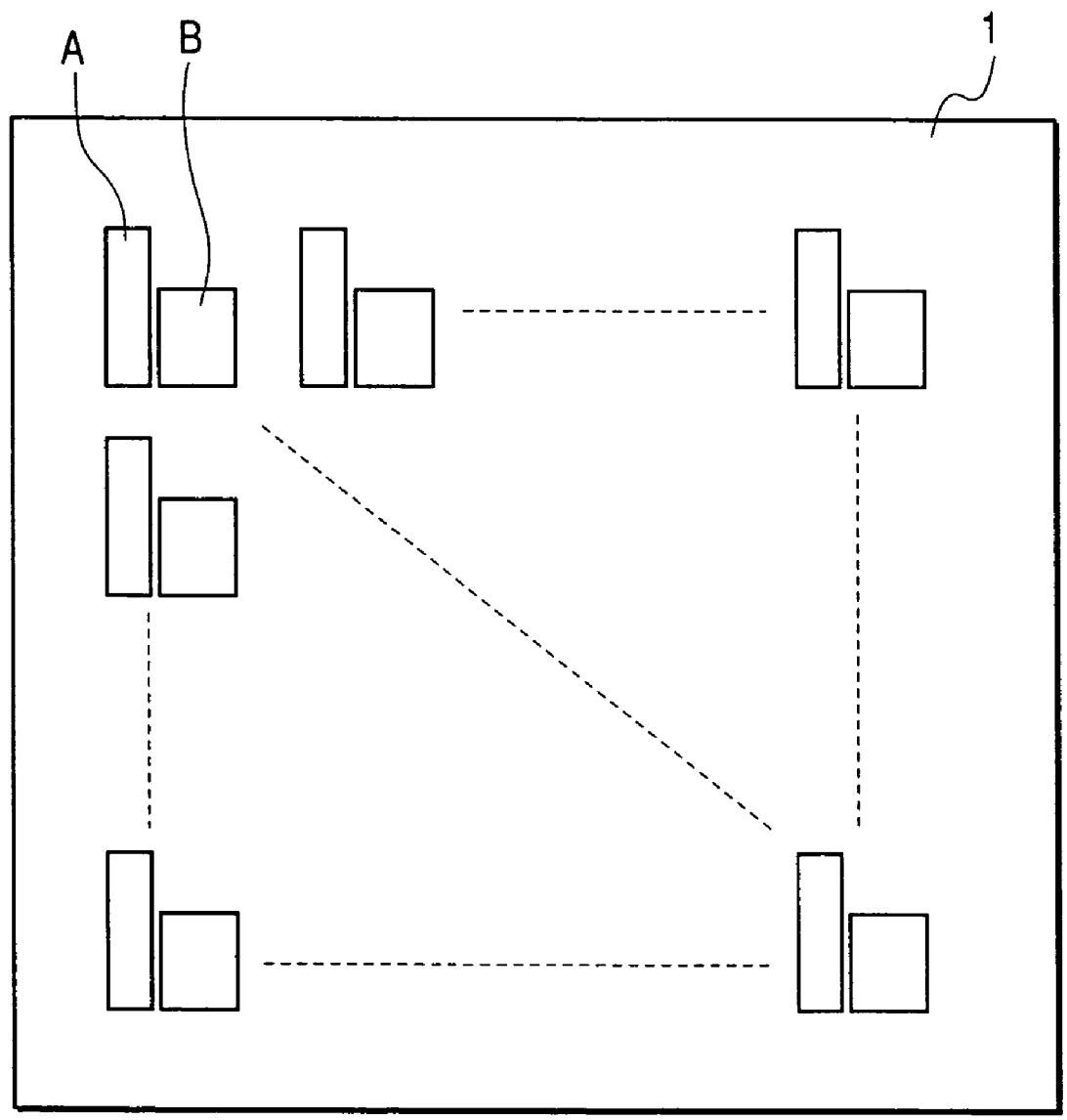
FIG. 1 is a schematic view of the device electrode pattern formed in Example 3 and Example 15.

The present invention provides a method of forming a pattern in which a resin patterned on a substrate is absorbed by dipping it in a solution containing metal components or by coating thereon a solution containing metal components, and then the substrate is washed to form thereon a pattern through a burning step. The present invention also provides a method of forming a pattern in which the above-mentioned solution containing the metal components is absorbed in a resin pattern capable of absorbing a solution containing metal compounds and capable of ion-exchanging the metal components, and then burning the resin pattern. In particular, the present invention provides a method of forming a metal or metal compound pattern by using a photosensitive resin and a solution containing metal components. Representative examples of the metal or metal compound pattern formed according to the present invention include an electrode, a wiring and an insulating layer composed of a metal oxide. Of the metal or metal compound patterns formed according to the present invention, the forming method of an electrically conductive pattern is useful, for example, for a manufacturing method of an electron emitting device having an electrode, for a manufacturing method of an electron source having a plurality of this electron emitting devices, and particularly for alleviating the burden of recovering and reusing the constituent materials in a manufacturing method of an image-forming apparatus using this electron source.

According to another aspect of the present invention, there is provided a pattern comprising: a first region having a first metal or the first metal compound and having a porosity of 60% or less; and a second region disposed so as to come into contact with the first region and having a second metal or a second metal compound which is different from the first metal or the first metal compound.

By virtue of the above arrangement, in the first region and the second region, for example, used as a device electrode constituting an electron emitting device, the constitution materials of a wiring connecting with the above-described device electrode is prevented from diffusing and an electron emitting device having preferable properties can be provided.

In the present invention, the term metal means a metal including even an alloy. The above description that "The first metal or the first metal compound is different from the second metal or the second metal compound" also refers to a case where these are composed of the same element but the ratio thereof is different.

For example, when each of the first region and the second region is constituted by a solder as an alloy of tin (Sn) and lead (Pb) at the ratio of Sn:Pb=7:3, and Sn:Pb=6:4, respectively, then the first region and the second region are different from each other and these are within the scope of the present invention. Also, when the first region and the second region are constituted using a mixed paste of silver (Ag) and lead oxide (PbO) used for a wiring, while varying the mixed ratio thereof between the first and second regions, the first region and the second region are different from each other.

As described above, the present invention may be applied to an electron emitting device and an image-forming apparatus using the device. Examples of the electron emitting device include a surface conductive-type electron emitting device in which an electrically conductive thin film is formed to connect with a pair of device electrodes that are formed so as to oppose with each other on an electrically insulating substrate, and then this electrically conductive thin film is subjected to a welding treatment referred to as a forming to locally destroy, deform or alter the electrically conductive thin film to thereby form a part having electrically high resistance including a crack, and which uses a phenomena that after forming the part having electrically high resistance including a crack, if a voltage is applied between the device electrodes and a parallel electric current is applied onto the surface of the electrically conductive thin film, an electron emission occurs through the part having electrically high resistance including the crack (electron emitting part). Other examples thereof include an electric field emitting-type electron emitting device referred to as "FE-type" or an electron emitting device having a metal/insulating layer/metal-type structure referred to as "MIM-type".

Examples of an electron source provided with a plurality of electron emitting devices and a wiring for driving a plurality of the electron emitting devices include an electron source having electron emitting devices disposed in a ladder-like fashion, in which a plurality of electron emitting devices having a pair of device electrodes are disposed in a matrix form in an X direction and a Y direction, one device electrode and another device electrode of a plurality of the electron emitting devices, which are disposed in the same line, are connected to a common wiring and in which, at the same time, an electron from the electron emitting devices can be control-driven by an control electrode (also referred to as "a grid") disposed above the electron emitting devices in the orthogonal direction to this wiring.

Another example of the electron source include an electron source in which a plurality of the electron emitting devices are disposed in a matrix form in an X direction and a Y direction, and one device electrode of a plurality of the electron emitting devices that are disposed in the same line is connected to a common wiring in the X direction and another device electrode of a plurality of the electron emitting devices disposed in the same line is connected to a common wiring in the Y direction. This is a so-called simple matrix arrangement.

Examples of an image-forming apparatus include those manufactured by combining the electron source as described above with image-forming members forming an image by the irradiation of an electron beam emitted from an electron emitting device of this electron source. If an image-forming member having a fluorescent material emitting a visible radiation by an electron is used, a display panel that may be used as a television or computer display can be fabricated. If a photosensitive drum is used as an image-forming member and a latent image is formed on this photoreceptor drum by the irradiation of an electron beam can be developed using toner, a copy machine or a printer can be manufactured.

With respect to the preferred embodiments of the present invention, materials used (a solution containing a resin and metal components), the method of forming the metal or metal compound pattern, in particular, the electrically conductive pattern of the present invention, a calculation method of the porosity, and the manufacturing method of the electron emitting device, the electron source, and the image-forming apparatus of the present invention are described in sequence below.

(1) Photosensitive Resin

The resin for use in the present invention is preferably a photosensitive resin and is not particularly limited as long as the resin pattern formed using the photosensitive resin can absorb a solution containing metal components that is described later. Both a water-soluble photosensitive resin and a solvent-soluble photosensitive resin may be used. The term "A water-soluble photosensitive resin" refers to a photosensitive resin that allows a development in the development step described later to be performed with water or a developer containing at least 50% by weight of water. The term "A solvent-soluble photosensitive resin" refers to a photosensitive resin that allows a development in a development step to be performed with an organic solvent or a developer containing at least 50% by weight of an organic solvent.

The photosensitive resin may be a resin having a photosensitive group in the resin structure or may be a resin having mixed therein a photosensitive agent such as cyclized rubber-bisazide resist. In either photosensitive resin component, a photoreaction initiator or a photoreaction inhibitor may be mixed as appropriate. The photosensitive resin may be a type (a negative type) that a photosensitive resin coating soluble in a developing solution turns to be insoluble in a developing solution by the photoirradiation or may be of a type (a positive type) in which a photosensitive resin coating insoluble in a developing solution turns to be soluble in a developing solution by the photoirradiation.

In the present invention, a general photosensitive resin can be used in a wide range as described above. Particularly preferred is an ion-exchangeable resin reacting with metal components in a solution containing metal components that is described later. A water-soluble photosensitive resin is also preferably used because a preferable work environment can be easily maintained and the resulting waste scarcely puts a load on nature.

The water-soluble photosensitive resin will be further described. This water-soluble photosensitive resin may be a resin which uses a developer containing at least 50% by weight of water and having added thereto a lower alcohol such as methyl alcohol or ethyl alcohol for increasing the drying rate or a component for attaining the dissolution acceleration or the stability improvement of the photosensitive resin components, within the range of less than 50% by weight. From the standpoint of reducing the environmental load, however, preferred is a resin that allows a development with a developer having a water content of 70% by weight or more, more preferred is a resin that allows a development with a developer having a water content of 90% by weight or more and most preferred is a resin that allows a development using only water as a developer. Examples of this water-soluble photosensitive resin include a resin comprising a water-soluble resin such as polyvinyl alcohol resin or polyvinyl pyrrolidone resin.

(2) Solution Containing Metal Components

The solution for use in the present invention is preferably a solution containing metal components. In this case, the solution may be an organic solvent-type solution comprising an organic solvent-type solvent containing 50% by weight or more of an organic solvent or may be an aqueous solution comprising an aqueous solvent containing 50% by weight or more of water, as long as it can form a metal or metal compound film by burning. For such a solution containing metal components, for example, there can be used a solution obtained by dissolving as metal components an organic solvent-soluble or a water-soluble metal organic compound formed of platinum, silver, palladium or copper in an organic solvent-type solvent or an aqueous solvent. Among these, a solution in which a platinum organic compound is dissolved is preferably used because an electrically conductive pattern which is very chemically stable can be easily obtained.

Similarly to the above-described photosensitive resin, the solution containing metal components for use in the present invention is preferably an aqueous solution because a preferable work environment can be easily maintained and the resulting waste scarcely puts a load on nature. The aqueous solvent for this aqueous solution may be an aqueous solvent containing 50% by weight or more of water and having added thereto, for example, a lower alcohol such as methyl alcohol or ethyl alcohol for accelerating the drying rate or having added thereto a component for achieving the dissolution acceleration or the stability improvement of the above-described metal organic compound, within the range of less than 50% by weight. From the standpoint of reducing the environmental load, however, the water content of the solvent is preferably 70% by weight or more, more preferably 90% by weight or more, and most preferably, the solvent is all water.

Examples of a water-soluble metal organic compound which can form an electrically conductive film particularly by burning include a complex compound of gold, platinum, silver, palladium, copper or the like.

The complex compound is preferably the one such that the ligand thereof is constituted by a nitrogen-containing compound having at least one hydroxyl group in a molecule. Among the complex compounds in which the ligand thereof is constituted by a nitrogen-containing compound having at least one hydroxyl group in a molecule, preferred is, for example, a complex compound such as alcoholamine, (ethanolamine, propanolamine, isopropanolamine and butanolamine or the like), selinenol and TRIS, in which the ligand thereof is constituted by any one of nitrogen-containing compounds having 8 or less carbon atoms or by two or more thereof.

The reasons why the complex compound is preferably used include its high water-solubility and low crystallinity. For example, in a commercially available ammine complex, a crystal precipitates during the drying and an uniform film is hardly obtained in some cases. If a "flexible" ligand such as those constituted by aliphatic alkylamine is used, the crystallinity can be lowered but the water-solubility may decrease due to hydrophobic property of an alkyl group. On the other hand, if a complex compound wherein the ligand is constituted as described above is used, a high water-solubility and a low-crystallinity may be obtained at the same time.

For the purpose of improving the film quality of the electrically conductive pattern obtained and improving the adhesion of the electrically conductive pattern to a substrate, for example, an element form such as rhodium, bismuth, ruthenium, vanadium, chromium, tin, lead and silicon or a compound thereof is preferably contained as a component of the above-described metal compound.

(3) Method of Forming Electrically Conductive Pattern

The formation of the electrically conductive pattern according to the present invention can be performed through the resin pattern forming steps as described below (coating step, drying step, exposing step and developing step), absorbing step, washing step, burning step, if desired, milling step.

The coating step is a step for coating the above-described photosensitive resin on an insulating substrate on which an electrically conductive pattern is to be formed. This coating can be performed using various printing methods (screen printing, off-set printing, flexographic printing), spinner method, dipping method, spray method, stamp method, rolling method, slit coater method, ink jet method or the like.

The drying step is a step for vaporizing a solvent in a photosensitive resin film that has been coated on the substrate in the above-described coating step to thereby dry the coating. The coating film can be dried at a room temperature but preferably dried through heating for shortening the drying time. The drying by heating can be performed using, for example, a no-wind oven, a dryer or a hot plate and can be generally performed by placing the film under a temperature of 50 to 100° C. for 1 to 30 minutes, though the conditions vary depending on the formulation or coating amount of the composition coated for forming an electrode and a wiring.

The exposing step is a step for exposing the photosensitive resin film on the substrate, which was dried in the above-described drying step, according to the predetermined resin pattern (for example, a predetermined shape of an electrode or a wiring). The region to be exposed by the photoirradiation in the exposing step varies depending on whether the photosensitive resin used is a negative-type resin or a positive-type resin. In the case of a negative-type resin that becomes insoluble in a developing solution by the photoirradiation, an exposure is performed by irradiating light to the region to be left as a desired resin pattern. On the other hand, in the case of a positive-type resin that becomes soluble in a developing solution by the photoirradiation, contrary to a negative-type resin, an exposure is performed by irradiating light to the region other than the region to be left as a resin pattern. The photoirradiation region and the non-irradiation region can be selected in the same manner as performed in a general mask formation by photoresist.

The developing step is a step for removing the photosensitive resin film in the region other than the region to be left as a desired resin pattern, in the photosensitive resin film that was exposed in the above-described exposing step. When the photosensitive resin is a negative type resin, a photosensitive resin film in the region where the photoirradiation was not performed is soluble in a developing solution and a photosensitive resin film in the region exposed by photoirradiation is made insoluble in a developing solution. Therefore, a development can be performed by dissolving and removing with a developing solution a photosensitive resin film in a non-photoirradiated portion that has not become insoluble in a developing solution. When the photosensitive resin is a positive-type resin, a portion of the photosensitive resin film which is not photoirradiated is insoluble in a developing solution and a portion of the photosensitive resin film that is exposed by the photoirradiation becomes soluble in a developing solution. Therefore, a development can be performed by dissolving and removing with a developing solution a photosensitive resin film in a photoirradiated portion which became soluble in a developing solution.

In the case of using a water-soluble photosensitive resin, a developing solution used is, for example, water or the same developing solution as used in a general water-soluble photoresist. In the case of using an organic solvent resin, a developing solution used may be an organic solvent or the same developing solution as used in a solvent-type photoresist. Here, as a step for forming a resin pattern, a forming step using a photosensitive resin has been described. In the case of using a resin other than the photosensitive resin, a resin pattern may be formed by lift-off or the like.

The absorbing step is a step for making the resin pattern formed as described above absorb the above-described solution containing metal components. The absorption can be performed by bringing the formed resin pattern into contact with the solution containing metal components. More specifically, the absorption can be performed, for example, by a dipping method in which the formed resin pattern is dipped in the solution containing metal components or a coating method in which the solution containing metal components is coated onto the formed resin pattern by a method such as spray method or spin-coating method. Before contacting the resin pattern with the solution containing metal components, for example, in the case of using the above-described aqueous solution, the resin pattern may be swelled in advance using the above-described aqueous solvent.

The washing step is a step performed after making the resin pattern absorb the solution containing metal components, for removing and washing an excess solution adhering to the resin pattern or an excess solution adhering to the parts other than the resin pattern. This washing step can be performed using the same washing solution as the solvent in the solution containing metal components, by a method of dipping in this washing solution a substrate having formed thereon the resin pattern or by a method of spraying the washing solution onto a substrate having formed thereon the resin pattern. The washing performed here is not limited to a washing with a washing solution as long as the excess solution can be washed away and thus it can be performed, for example, by a method using air spraying or vibration. In this washing step, the solution containing metal components may be slightly removed. However, the amount removed is extremely small and therefore, even if this is recovered and reused, can be drastically reduced as compared with the conventional method.

The burning step is a step for burning a resin pattern (a photosensitive resin film in a photoirradiation portion in the case of a negative-type resin and a photosensitive resin film in a non-photoirradiation portion in the case of a positive-type resin) that was obtained through the developing step, the absorbing step and the washing step, and decomposing and removing the organic components in the resin pattern to form an electrically conductive film using the metal components in the solution containing metal components absorbed in the resin pattern. The burning can be performed in an atmosphere when the electrically conductive film to be formed is a noble metal film. Also, the burning can be performed in a vacuum or a deoxidation atmosphere (for example, in an inert gas atmosphere such as nitrogen) when the electrically conductive film to be formed is a film formed of a metal that easily oxidize, such as copper and palladium. In the case of forming an insulating pattern, an insulant can be formed by burning Pb or the like in an oxygen atmosphere (such as in an air). The burning can be generally performed by placing the resin pattern under a temperature of 400 to 600° C. for several minutes to several tens of minutes, though the conditions vary according to the kinds of organic components contained in the resin pattern. The burning can be performed, for example, by using a circulating hot air oven. By this burning, an electrically conductive pattern can be formed on a substrate as a metal film having a shape according to the predetermined pattern.

After the burning step, a milling step may be performed if needed. The milling step is a step of patterning a metal film formed on a substrate surface. The ion milling method used may be any of the generally used methods. The resist used may be a positive resist or a negative resist. In exposure, the photosensitive resin film is exposed using a predetermined mask and developed to obtain a predetermined pattern. The exposed surface is etched by an ion milling method or the like. The etching can be performed by any method as long as the metal surface can be etched. Finally, the resist is peeled off, and the peeling solution may be selected as appropriate according to the kind of the resist used.

The preferable embodiment of the present invention was described above. According to this embodiment, a pattern can be formed with a high utilization efficiency of materials and at a low cost.

When forming a metal or metal compound pattern according to the above-described preferable embodiment, it is important to control the absorption ability of a resin pattern such as control of the resin pattern thickness, and to control the absorption conditions in the absorbing step such as control of the dipping time or the coating time, for controlling the electrical properties of the formed pattern as well as the function of preventing diffusion of dissimilar metals. By this control, the porosity of formed pattern can be desirably controlled.

Incidentally, the method for obtaining a pattern having a desired porosity is not limited to the above-described manufacturing method, and a pattern having a desired porosity can also be obtained by the method according to Examples 11 and 13 as described later.

Next, the porosity of the film pattern formed according to the present invention will be described in detail below.

(4) Porosity of Metal or Metal Compound Pattern Diffusion Movement of Contamination Component and Stability of Sheet Resistance.

The film structure of the present invention, in which 60% or less of porosity (40% or more of density) is provided, will be described.

Here, the porosity of a metal film pattern in the case of using it as an electrode will be described. As described above, with regard to the film quality of a metal film manufactured by sputtering method, the porosity is almost 0% (i.e., the density is 100%) and thus the density approaches that of pure metal. By virtue of this, the metal film pattern is used as an electrode which is stable in electrode properties. It is found that when this electrode is joined to dissimilar metals or contamination metal compounds, these dissimilar metals or contamination metal compounds diffuse and move. For example, in a case where Ag of the like is printed on a Pt electrode by sputtering method, a large amount of Ag diffuses on the Pt electrode. Accordingly, due to the diffusion of dissimilar metals on the Pt electrode, the electrical properties of the electrode change, which often becomes a problem.

It was verified that, when, in particular, Ag or the like diffuses to an electrode constituting an electron emitting device, the diffusion of dissimilar metals exerts great influence on electron emitting properties (Japanese Patent Application Laid-open No. 2000-243327). As a result of our studies, it was proved that such diffusion of dissimilar metals can be suppressed by providing voids on a metal or metal compound pattern. From the standpoint of preventing the diffusion of dissimilar metals, it is effective that the pattern preferably has the porosity of 10% or more, more preferably 20% or more. In particular, when the diffusion of dissimilar metals such as Ag to an electron emitting device takes place, the electron emitting property greatly changes depending on the diffusion amount, and therefore the diffusion amount of the dissimilar metals must be suppressed to such a degree that does not cause any adverse influence on electron emitting property. In order to attain this, it was revealed that the porosity is preferably 10% or more, and more preferably 20% or more.

On the other hand, when the porosity is 60% or more (density is 40% or less), the film becomes porous. In case of joining such an electrode with dissimilar metals, contamination metal compounds or the like, it was found that, since a movement path of the dissimilar metal to be diffused is porous, an environment where it is difficult for the dissimilar metal to move is formed. However, such a porous electrode having the porosity of 60% or more is inferior in the resistance stability, and therefore there is a case where the porous electrode may not obtain stable properties. This also gives rise to a problem not only in an electrically conductive pattern such as an electrode but also in an insulating pattern because the electrical properties (insulating property) are insufficient.

During the formation of an electrode on a large substrate such as PDP, the film thickness distribution may vary on the order of ±20% in such a porous electrode. In such a case, the variation of the resistance value is greater than that of the film thickness distribution, which is a problem as a device using the electrode.

In view of this, in the metal or metal compound pattern of the present invention, the variation of sheet resistance can be minimized and moreover, there arises no problem in electrode properties. Further, in the case of using the pattern as the electrode of the electron emitting device, the diffusion movement of dissimilar metals or contamination metal compounds can be suppressed and the degradation of electron emitting property can be suppressed.

Calculation Method of Porosity

The porosity as described in the present invention is calculated based on the measured value of density. First, the calculation method of density is described Pt electrode as an example. The density is provided as the Pt abundance per unit volume.

Pt density=(Pt abundance of the present invention/film thickness)/(Pt abundance of reference/film thickness)

Where, the Pt abundance of reference is a Pt abundance of Pt pattern formed by a sputtering process. Pt abundance was measured using EPMA (electron probe-microanalyzer).

On the basis of the thus obtained density, the porosity is provided as:

Pt porosity=1−Pt density. The film thickness was measured using a stylus system thicknessmeter.

(5) Manufacturing Method of Electron Emitting Device, Electron Source and Image-Forming Apparatus The above-described electrically conductive pattern formation method of the present invention may be suitably applied to a manufacturing method of: an electron emitting device comprising electrodes; an electron source providing a plurality of electron emitting devices having electrodes and a wiring for driving the plurality of electron emitting devices; and further an image-forming apparatus comprising this electron source and an image-forming member for forming an image by the irradiation of electron beam emitted from an electron emitting device of the electron source. More specifically, for the manufacture of the electron emitting device, an electrode is formed according to the method of the present invention; and for the manufacture of the electron source or the image-forming apparatus, one or both of the electrodes of the electron emitting device and the wiring used is (are) formed according to the method of the present invention, whereby the amount of materials constituting the electrode and/or the wiring which are removed during the manufacturing step can be greatly reduced and the time and labor required for processing such materials removed during the manufacture can be greatly reduced.

As described hereinabove, preferred examples of the electron emitting device having the electrodes that are manufactured using the electrically conductive pattern forming method of the present invention preferably includes a cold cathode device such as a surface conductive-type electron emitting device, a field emission-type (FE-type) electron emitting device and a metal/insulating layer/metal-type (MIM-type) electron emitting device. Among these, particularly preferred is a surface conductive-type electron emitting device in which a large number of electrodes of electron emitting devices can be easily formed at one processing using the method of the present invention. According to the method of the present invention, simultaneous with formation of the device electrodes for the plurality of electron emitting devices, a wiring necessary for driving each electron emitting device can be formed. Therefore, the electron source having a plurality of the electron emitting devices can be easily manufactured and further, the manufacture of an image-forming apparatus, which is achieved by combining this electron source with an image-forming member for forming an image by the irradiation of an electron beam from the electron emitting device constituting the electron source, can be made significantly easier.

EXAMPLES

The present invention is described in greater detail below by referring to the Examples, however, the present invention is not limited to these examples.

Example 1

A solution obtained by adding 0.06 wt % of an amine silane coupling agent (KBM-603, produced by Shin-Etsu Chemical Co., Ltd.) to a photosensitive resin (sun resiner BMR-850, produced by Sanyo Kasei Co., Ltd.) was coated over the entire surface of a glass substrate (75 mm in length×75 mm in width×2.8 mm in thickness) with a roll coater and dried at 45° C. for 2 minutes using a hot plate. Subsequently, using a negative photomask, the substrate and the mask were brought into contact with each other, and an exposure was performed thereon for 2 seconds in exposing time by an ultra-high pressure mercury lamp (illuminance: 8.0 mW/cm$^2$) as a light source. Thereafter, the resulting substrate was processed by dipping for 30 seconds in pure water as a developer, thus obtaining an objective resin pattern. The film thickness of the resin pattern obtained was 1.55 μm.

This resin pattern-formed substrate was dipped in pure water for 30 seconds and, then, dipped in a Pt—Pb solution (platinum (II) monoethanolamine acetate complex·platinum content: 2% by weight/lead (II) acetate·lead content: 200 ppm) for 60 seconds.

Subsequently, the substrate was taken out from the Pt—Pb solution, washed with flowing water for 5 seconds to wash the Pt complex solution between the resin patterns, dewatered by spraying thereon air and dried for 3 minutes by a hot plate at 80° C.

Thereafter, the substrate dried was burned at 500° C. for 30 minutes in a circulating hot air oven to form a platinum electrode having a distance between electrodes of 20 μm, a width of 60 μm, a length of 120 μm and a thickness of 20 nm.

The sheet resistance of this electrode was 60 Ω/□.

Example 2

A platinum electrode was formed in the same manner as in Example 1 except for using a Pt solution (tetraammineplatinum (II) acetate complex·platinum content: 2% by weight) as a metal organic compound solution.

The thickness of this electrode was 25 nm and the sheet resistance thereof was 40 Ω/□.

Example 3

A platinum electrode was formed in the same manner as in Example 1 except for using a Pt—Pb solution (tetraammineplatinum (II) acetate complex·platinum content: 2% by weight/lead (II) acetate·lead content: 200 ppm) as a metal organic compound solution.

The thickness of this electrode was 30 nm and the sheet resistance thereof was 55 Ω/□.

Example 4

Using the electrically conductive pattern forming method of the present invention, a plurality of surface conductive-type electron emitting devices were manufactured and, moreover, a wiring for driving this plurality of surface conductive-type electron emitting devices was formed to thereby manufacture an electron source. Further, an image-forming apparatus was manufactured using this electron source. The manufacturing procedure thereof will be described below on the basis of FIG. 1 and FIG. 2.

Step 1: On a glass-made substrate 1 having a size of 300 mm in length×300 mm in width×2.8 mm in thickness, a plurality of device electrode pairs (first region) as shown in FIG. 1 were manufactured in the same manner as in Example 1.

The device electrode pair in this Example was formed by opposing a device electrode A having a width of 60 μm and a length of 480 μm to a device electrode B having a width of 120 μm and a length of 200 μm in an electrode gap of 20 μm. The device electrode pairs were disposed on the substrate 1 in a matrix form by adjusting so that the pitch between the device electrode pair was 300 μm in a lateral direction and 650 μm in a longitudinal direction and the number of device electrode pairs was 720×240. A platinum film pattern having a size of 1 cm×1 cm was formed at the same time as the formation of the device electrode pair. The sheet resistance in that case was measured and it was found to be 26 Ω/□.

Figure 2:
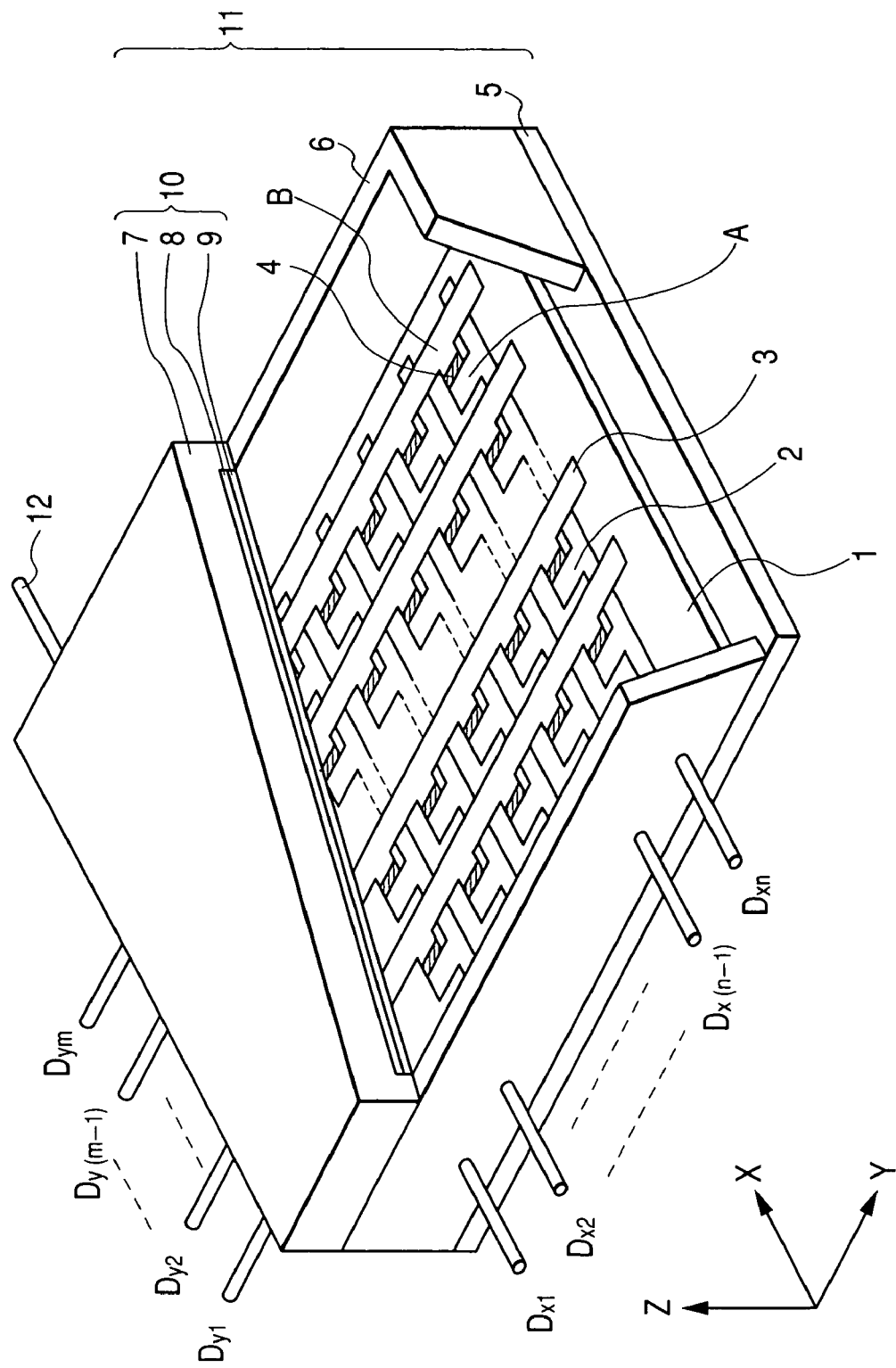
FIG. 2 is a schematic view showing a display panel portion of the image-forming apparatus manufactured in Example 3 and Example 15.

Step 2: As shown in FIG. 2, an X direction wiring 2 (second region) connecting one device electrode A of the device electrode pair in each line was provided using an Ag paste by a screen printing method. Subsequently, an interlayer insulating layer (not shown in the figure) having a thickness of 20 μm was provided by a screen printing method, and a Y-direction wiring 3. (second region) connecting another device electrode B of the device electrode pair in each line was provided thereon in the same manner as in the X-direction wiring 2 and the substrate was burned. In this manner, the X-direction wiring 2 and the Y-direction wiring 3 were provided.

Step 3: The substrate 1 having formed thereon the X-direction wiring 2 and the Y-direction wiring 3 in Step 2 was washed with pure water.

Step 4: In an aqueous solution having dissolved therein polyvinyl alcohol in a concentration of 0.05% by weight, 2-propanol in a concentration of 15% by weight and ethylene glycol in a concentration of 1% by weight, a palladium-monoethanolamine acetate complex was dissolved so as to have a palladium concentration of about 0.15% by weight, whereby a light yellow aqueous solution was obtained.

By an ink jet method, droplets of the above-described aqueous solution were imparted four times to the same portion from the upper position of the device electrodes A and B constituting each device electrode pair so as to straddle the device electrodes A and B and to be given within the electrode gap (dot size=about 100 μm).

The substrate 1 having given thereon the droplets of the aqueous solution was burned for 30 minutes in a burning oven at 350° C., a palladium thin film 4 for connecting between the device electrodes A and B constituting the device electrode pair was formed between each device electrode pair, and then the substrate 1 was fixed on a rear plate 5.

Step 5: A face plate 10, in which a fluorescent film 8 and a metal back 9 were formed on the inner surface of a glass-made substrate 7 that is different from the substrate 1, was caused to face the rear plate 5, and these were sealed through a supporting frame 6 to thereby constitute an envelope 11. To the supporting frame 6, an air supply and exhaust pipe used for ventilating and exhausting air was adhered in advance.

Step 6: After exhausting the inside of the envelope to $1.3 \times 10^{-5}$ Pa through the air supply and exhaust pipe, a forming was performed in every line in a manner that, by using X-direction terminals $D_{x1}$ to $D_{xn}$ ranging with each X-direction wiring 2 and the Y-direction terminals $D_{y1}$ to $D_{ym}$ ranging with each Y-direction wiring 3, a voltage was applied between the device electrode pairs in each line to produce a cracking part having a size of tens of μm on the palladium thin film 4 between the device electrodes A and B, whereby a surface conductive-type electron emitting device was formed.

Step 7: After exhausting the inside of the envelope 11 to $1.3 \times 10^{-5}$ Pa, benzonitrile was introduced into the envelope 11 from the air supply and exhaust pipe until the inside of the envelope 11 is elevated to $1.3 \times 10^{-2}$ Pa. In the same manner as in the above-described forming, a pulse voltage was fed between each device electrode pair and an activation for depositing a carbon on the cracking portion of the palladium thin film was performed. The pulse voltage was applied for 25 minutes to each line.

Step 8: The inside of the envelope 11 was sufficiently exhausted through the air supply and exhaust pipe and, then, further exhausted while heating the entire envelope 11 at 250° C. for 3 hours. Finally, a getter was flashed thereto and the air supply and exhaust pipe was sealed.

In this manner, a display panel as shown in FIG. 2 was manufactured, and a driving circuit comprising a scan circuit, a control circuit, a modulation circuit and a d.c. voltage source (all are not shown) was connected thereto, thereby manufacturing a panel-shaped image-forming apparatus.

A predetermined voltage was applied by time sharing to each surface conductive-type electron emitting device through the X-direction terminals $D_{x1}$ to $D_{xn}$ and the Y-direction terminals $D_{y1}$ to $D_{Ym}$, and a high voltage was applied to the metal back 9 through the high voltage terminal 12, whereby an arbitrary matrix image pattern can be displayed with a preferable image quality. Note that, when the panel was decomposed and the diffusion of Ag to the electron emitting device was measured, it was confirmed that the diffusion of Ag was sufficiently prevented.

In this Example, the manufacturing method of Example 1 was applied to form the device electrode. However, in the constitution in which the wiring electrode in contact with other metal, provided that the manufacturing method of Example 1 was applied to the formation of the wiring, the same effects as the above can be obtained.

Example 5

An image-forming apparatus was manufactured in the same manner as in Example 4 except for using a Pt—Pb solution (tetraammineplatinum (II) acetate·complex·platinum content: 2% by weight/lead (II) acetate·lead content: 200 ppm) as a metal organic compound solution. An arbitrary matrix image pattern was able to be displayed with a preferable image quality.

Example 6

A solution obtained by adding 0.06 wt % of an amine silane coupling agent (KBM-603, produced by Shin-Etsu Chemical Co., Ltd.) to a photosensitive resin (sun resiner BMR-850, produced by Sanyo Kasei Co., Ltd.) was coated over the entire surface of a glass substrate (75 mm in length×75 mm in width×2.8 mm in thickness) with a spin coater and dried at 45° C. for 2 minutes using a hot plate. Subsequently, using a negative photomask, the substrate and the mask were brought into contact with each other, and an exposure was performed thereon for 2 seconds in exposing time by an ultra-high pressure mercury lamp (illuminance: 8.0 mW/cm$^2$) as a light source Thereafter, the resulting substrate was processed by dipping for 30 seconds in pure water as a developer, thus obtaining an objective pattern. The film thickness of the pattern formed was 0.98 μm.

This substrate was dipped in pure water for 30 seconds and, then, dipped in a Pt complex solution (platinum (II) monoethanolamine acetate complex platinum content: 2% by weight) for 30 seconds.

Subsequently, the substrate was taken out from the Pt complex solution, washed with a flowing water for 5 seconds to wash the Pt complex solution between the patterns, dewatered with air and dried for 3 minutes by a hot plate at 80° C.

Thereafter, the substrate dried was burned at 500° C. for 30 minutes in a circulating hot air oven to form a platinum electrode having a thickness of 30 nm.

The sheet resistance of this electrode was 80 Ω/□.

Example 7

A solution obtained by adding 0.06 wt % of an amine silane coupling agent (KBM-603, produced by Shin-Etsu Chemical Co., Ltd) to a photosensitive resin (sun resiner BMR-850, produced by Sanyo Kasei Co., Ltd.) was coated over the entire surface of a glass substrate (75 mm in length×75 mm in width×2.8 mm in thickness) with a spin coater and dried at 45° C. for 2 minutes using a hot plate. Subsequently, using a negative photomask, the substrate and the mask were brought into contact with each other, and an exposure was performed thereon for 2 seconds in the exposing time by an ultra-high pressure mercury lamp (illuminance: 8.0 mW/cm$^2$) as a light source. Thereafter, the resulting substrate was processed by dipping for 30 seconds in pure water as a developer, thus obtaining an objective pattern. The film thickness of the pattern formed was 1.08 μm.

This pattern formed-substrate was dipped in pure water for 30 seconds and, then, dipped in a Pt—Pb solution (platinum (II) monomethanolamine acetate complex·platinum content: 2% by weight/lead (II) acetate·lead content: 200 ppm) for 30 seconds.

Subsequently, the substrate was taken out from the Pt-Pb solution, washed with flowing water for 5 seconds to wash the Pt—Pb solution between the patterns, dewatered with air and dried for 3 minutes by a hot plate at 80° C.

Thereafter, the substrate dried was burned at 500° C. for 30 minutes in a circulating hot air oven to form a platinum electrode having a distance between electrodes of 20 μm, a width of 60 μm, a length of 120 μm and a thickness of 40 nm.

The sheet resistance of this electrode was 120 Ω/□.

Examples 7-2

A platinum electrode was formed in the same manner as in Example 7 except for changing the metal organic compound solution to a Pt—Ru solution (platinum (II) monoethanolamine acetate complex·platinum content: 2% by weight/ruthenium (III) chloride·ruthenium content: 200 ppm) and changing the dipping time to 120 seconds. A platinum electrode having a distance between electrodes of 20 µm, a width of 60 µm, a length of 120 µm and a thickness of 42 nm was formed. The sheet resistance of this electrode was 12 Ω/□.

Examples 7-3

A platinum electrode was formed in the same manner as in Example 7 except for changing the metal organic compound solution to a Pt—Sn solution (platinum (II) monoethanolamine acetate complex·platinum content: 2% by weight/stannum (III) chloride·stannum content: 200 ppm) and changing the dipping time to 30 seconds. A platinum electrode having a distance between electrodes of 20 µm, a width of 60 µm, a length of 120 µm and a thickness of 56 nm was formed. The sheet resistance of this electrode was 80 Ω/□.

Examples 7-4

A platinum electrode was formed in the same manner as in Example 7 except for changing the metal organic compound solution to a Pt—V solution (platinum (II) monoethanolamine acetate complex·platinum content: 2% by weight/vanadyl (IV) salfate·vanadium content: 200 ppm) and changing the dipping time to 60 seconds. A platinum electrode having a distance between electrodes of 20 µm, a width of 60 µm, a length of 120 µm and a thickness of 38 nm was formed. The sheet resistance of this electrode was 64 Ω/□.

Example 8

A resin (polyvinyl alcohol) was coated over the entire surface of a glass substrate (75 mm in length×75 mm in width×2.8 mm in thickness) with a spin coater and dried at 45° C. for 2 minutes using a hot plate. Subsequently, the entire surface of the substrate was exposed for 2 seconds in exposing time by an ultra-high pressure mercury lamp (illuminance: 8.0 mW/cm$^2$) as a light source. Thereafter, the resulting substrate was processed by dipping for 30 seconds in pure water as a developer. The film thickness thereof was 1.85 µm.

This substrate was dipped in pure water for 30 seconds and, then, dipped in a Pt—Pb solution (platinum (II) monoethanolamine acetate complex·platinum content: 2% by weight/lead (II) acetate lead content: 200 ppm) for 120 seconds.

Subsequently, the substrate was taken out from the Pt—Pb solution, washed with a flowing water for 5 seconds to wash the Pt—Pb solution between the patterns, dewatered with air and dried for 3 minutes by a hot plate at 80° C.

Thereafter, the substrate dried was burned at 500° C. for 30 minutes in a circulating hot air oven to form a platinum electrode having a distance between electrodes of 20 pin, a width of 60 µm, a length of 120 µm and a thickness of 60 nm.

The sheet resistance of this electrode was 160 Ω/□.

Subsequently, a resist (positive-type resist LC10/10 cp, produced by Shipley Company) was coated (1200 rpm/5 seconds, film thickness: 1.3 micron) on this substrate with a spinner.

The coated resist was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to form an objective pattern and a platinum electrode having a distance between electrodes of 20 µm, a width of 60 µm and a length of 120 µm.

Example 8-2

A platinum electrode was formed in the same manner as in Example 8 except for changing the metal organic compound solution to a Pt—Zn solution (platinum (II) monoethanolamine acetate complex·platinum content: 2% by weight/zinc (II) acetate·zinc content: 200 ppm) and changing the dipping time to 15 seconds.

A platinum electrode having a distance between electrodes of 20 µm, a width of 60 µm, a length of 120 µm and a thickness of 44 nm was formed. The sheet resistance of this electrode was 250 Ω/□.

Example 8-3

A platinum electrode was formed in the same manner as in Example 8 except for changing the metal organic compound solution to Pt—Rh solution (platinum (II) monoethanolamine acetate complex·platinum content: 2% by weight/rhodium (III) nitrate·rhodium content: 200 ppm) and changing the dipping time to 60 seconds.

A platinum electrode having a distance between electrodes of 20 µm, a width of 60 µm, a length of 120 µm and a thickness of 51 nm was formed. The sheet resistance of this electrode was 190 Ω/□.

Example 8-4

A platinum electrode was formed in the same manner as in Example 8 except for changing the metal organic compound solution to a Pt—Cr solution (platinum (II) monoethanolamine acetate complex·platinum content: 2% by weight/chromium (III) acetate chromium content: 200 ppm) and changing the dipping time to 60 seconds.

A platinum electrode having a distance between electrodes of 20 µm, a width of 60 µm, a length of 120 µm and a thickness of 43 nm was formed. The sheet resistance of this electrode was 99 Ω/□.

Example 9

A resin (polyvinyl alcohol) was coated over the entire surface of a glass substrate (75 mm in length×75 mm in width×2.8 mm in thickness) with a spin coater and dried at 45° C. for 2 minutes using a hot plate. Subsequently, the entire surface of the substrate was exposed for 2 seconds in exposing time by an ultra-high pressure mercury lamp (illuminance: 8.0 mW/cm$^2$) as a light source. Thereafter, the resulting substrate was processed by dipping for 30 seconds in pure water as a developer. The film thickness thereof was 2.3 µm.

This substrate was dipped in pure water for 30 seconds and, then, dipped in a Pt—Pb solution (platinum (II) monoethanolamine acetate complex·platinum content: 2% by weight/lead (II) acetate·lead content: 200 ppm) for 60 seconds.

Subsequently, the substrate was taken out from the Pt—Pb solution, washed with flowing water for 5 seconds to wash the Pt—Pb solution between the patterns, dewatered with air and dried for 3 minutes by a hot plate at 80° C.

Thereafter, the substrate dried was burned at 500° C. for 30 minutes in a circulating hot air oven to form a platinum electrode having a distance between electrodes of 20 µm, a width of 60 µl, a length of 120 µm and a thickness of 60 nm.

The sheet resistance of this electrode was 39 Ω/□.

Subsequently, a resist (positive-type resist LC100/10 cp, produced by Shipley Company) was coated (1200 rpm/5 seconds, film thickness: 1.3 micron) on this substrate with a spinner.

The coated resist was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to form an objective pattern and a platinum electrode having a distance between electrodes of 20 μm, a width of 60 μm and a length of 120 μm.

Example 9-1

A platinum electrode was formed in the same manner as in Example 9 except for changing the metal organic compound solution to a Pt—Bi solution (platinum (II) monoethanolamine acetate complex·platinum content: 2% by weight/EDTANH4-bismuth (III) acetate·bismuth content: 200 ppm) and changing the dipping time to 90 seconds.

A platinum electrode having a distance between electrodes of 20 μm, a width of 60 μm, a length of 120 μm and a thickness of 32 nm was formed. The sheet resistance of this electrode was 66 Ω/□.

Example 9-2

A platinum electrode was formed in the same manner as in Example 9 except for changing the metal organic compound solution to a Pt—Si solution platinum (II) monoethanolamine acetate complex·platinum content: 2% by weight/3-(2-aminoethyl)propyltriethoxysilane·silicon content: 200 ppm) and changing the dipping time to 60 seconds.

A platinum electrode having a distance between electrodes of 20 μm, a width of 60 μm, a length of 120 μm and a thickness of 78 nm was formed. The sheet resistance of this electrode was 105 Ω/□.

Example 10

A resin (polyvinyl alcohol) was coated over the entire surface of a glass substrate (75 mm in length×75 mm in width×2.8 mm in thickness) with a spin coater and dried at 45° C. for 2 minutes using a hot plate. Subsequently, the entire surface of the substrate was exposed for 2 seconds in exposing time by an ultra-high pressure mercury lamp (illuminance: 8.0 mW/cm$^2$) as a light source. Thereafter, the resulting substrate was processed by dipping for 30 seconds in pure water as a developer. The film thickness thereof was 2.3 μm.

This substrate was dipped in pure water for 30 seconds and then, dipped in a Pt solution (platinum (II) monoethanolamine acetate complex·platinum content: 2% by weight) for 120 seconds.

Subsequently, the substrate was taken out from the Pt solution, washed with a flowing water for 5 seconds to wash the Pt complex solution between the resin patterns, dewatered with air and dried for 3 minutes by a hot plate at 80° C.

Thereafter, the substrate dried was burned at 500° C. for 30 minutes in a circulating hot air oven to form a platinum electrode having a distance between electrodes of 20 μm, a width of 60 μm, a length of 120 μm and a thickness of 40 nm. The sheet resistance of this electrode was 18 Ω/□.

Subsequently, a resist (positive-type resist LC100/10 cp, produced by Shipley Company) was coated (1200 rpm/5 seconds, film thickness: 1.3 micron) on this substrate with a spinner.

The coated resist was etched (etching conditions are: acceleration voltage: 500 V, current: 600 mA, deceleration voltage: 200 V, gas seed: argon 255 CCM and carrier speed: 5 mm/second) by ion milling method, and then the resist was peeled off using a resist peeling solution (1112A, produced by Shipley Company) to form an objective pattern and a platinum electrode having a distance between electrodes of 20 μm, a width of 60 μm and a length of 120 μm.

Example 11

A metal organic compound aqueous solution tetrakis(monoethanolamino)platinum (II) acetate complex·platinum content: 5% by weight and a resin (polyvinyl alcohol) aqueous solution were mixed in the following ratio to thereby prepare a composition 11-A.

Metal organic compound: 50 parts by weight
Polyvinyl alcohol resin: 50 parts by weight This composition 11-A was coated over the entire surface of a glass-made substrate (75 mm in length×75 mm in width×2.8 mm in thickness) with a spin coater and dried at 80° C. for 2 minutes. The film thickness after drying was 2.1 μm.

Subsequently, the substrate having coated film was placed in a circulating hot air oven and burned at 500° C. for 30 minutes. As a result, a platinum having a thickness of 60 nm was formed. Using a simultaneously-formed platinum film pattern having a size of 1 cm×1 cm, the sheet resistance was measured, and it was found to be 14 Ω/□.

Thereafter, on this substrate, a resist (positive-type resist LC100/10 cp, produced by Shipley Company) was coated (1200 rpm/5 seconds, film thickness: 1.3 micron) with a spinner.

The coated resist was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to form an objective pattern and a platinum electrode having a distance between electrodes of 20 μm, a width of 60 μm and a length of 120 μm.

Example 12

A solution obtained by adding 0.06 wt % of an amine silane coupling agent (KBM-603, produced by Shin-Etsu Chemical Co., Ltd.) to a photosensitive resin (sun resiner BMR-850, produced by Sanyo Kasei Co., Ltd.) was coated over the entire surface of a glass substrate (75 mm in length×75 mm in width×2.8 mm in thickness) with a spin coater and dried at 45° C. for 2 minutes using a hot plate. Subsequently, the substrate and the mask were brought into contact with each other, and the entire surface of the substrate was exposed for 2 seconds in exposing time by an ultra-high pressure mercury lamp (illuminance: 8.0 mW/cm$^2$) as a light source. Thereafter, the resulting substrate was processed by dipping for 30 seconds in pure water as a developer, thus obtaining an objective pattern. The film thickness thereof after the pattern formation was 1.55 μm.

This substrate was dipped in a Pt complex solution (platinum (II) monoethanolamine acetate complex·platinum content: 2% by weight) for 120 seconds.

Subsequently, the substrate was taken out from the Pt complex solution, washed with flowing water for 5 seconds to wash the Pt complex solution between the patterns, dewatered with air and dried for 3 minutes by a hot plate at 80° C.

Thereafter, the substrate dried was burned at 500° C. for 30 minutes in a circulating hot air oven to form a platinum electrode having a thickness of 76 nm.

The sheet resistance of this electrode was 9 Ω/□.

Thereafter, on this substrate, a resist (positive-type resist LC100/10 cp, produced by Shipley Company) was coated (1200 rpm/5 seconds, film thickness: 1.3 micron) with a spinner.

The coated resist was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to form an objective pattern and a platinum electrode having a distance between electrodes of 20 μm, a width of 60 μm and a length of 120 μm.

Example 13

A metal organic compound bis(acetylacetonato)platinum (II) and an acrylic copolymer resin propylene glycol monomethyl ether solution were mixed in the following ratio to prepare a composition 13-A.

Metal organic compound: 50 parts by weight
Acrylic copolymer resin: 50 parts by weight This composition 13-A was coated over the entire surface of a glass-made substrate (75 mm in length×75 mm in width×2.8 mm in thickness) with a spin coater and dried at 80° C. for 2 minutes by a hot plate. The film thickness thereof after drying was 1.5 μm.

Subsequently, the substrate having the coated film was placed in a circulating hot air oven and burned at 550° C. for one hour. As a result, a platinum having a thickness of 42 nm was formed. The sheet resistance of this platinum was measured, and it was found to be 35 Ω/□.

Thereafter, on this substrate, a resist (positive-type resist LC100/10 cp, produced by Shipley Company) was coated (1200 rpm/5 seconds, film thickness: 1.3 micron) with a spinner.

The coated resin was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to form an objective pattern and a platinum electrode having a distance between electrodes of 20 μm, a width of 60 μm and a length of 120 μm.

Example 14

A cyclized rubber and a 4,4'-diazidochalcone xylene solution were mixed in the following ratio to prepare a composition 14-A.

Cyclized rubber: 95 parts by weight
4,4'-diazidochalcone: 5 parts by weight

This composition 14-A was coated over the entire surface of a glass-made substrate (75 mm in length×75 mm in width×2.8 mm in thickness) with a spin coater and dried at 80° C. for 2 minutes using a hot plate. The film thickness thereof after drying was 1.5 μm.

Subsequently, using a negative photomask, the substrate and the mask were brought into contact with each other, and an exposure was performed thereon for 10 seconds in exposing time by an ultra-high pressure mercury lamp (illuminance: 8.0 mW/cm$^2$) as a light source. Thereafter, the resulting substrate was processed by dipping for 30 seconds in xylene as a developer to obtain an objective resin pattern. The film thickness thereof after the pattern formation was 1.0 μm.

This substrate was dipped in a Pt complex acetone solution (bis(acetylacetonato)platinum (II).platinum content: 2% by weight) for 30 seconds.

Subsequently, the substrate was taken out from the Pt complex acetone solution, washed with flowing water for 5 seconds to wash the Pt complex solution between the patterns, dewatered with air and dried for 3 minutes by a hot plate at 80° C.

Thereafter, the substrate dried was burned at 500° C. for 30 minutes in a circulating hot air oven to form a platinum electrode having a thickness of 25 nm.

The sheet resistance of this electrode was 100 Ω/□.

Comparative Example

On a glass-made substrate (75 mm in length×75 mm in width×2.8 mm in thickness), Ti was first deposited at a thickness of 5 nm and Pt was subsequently deposited at a thickness of 45 nm by sputtering method. Subsequently, on this substrate, a resist (positive-type resist LC100/10 cp, produced by Shipley Company was coated (1200 rpm/5 seconds, film thickness: 1.3 μm) with a spinner.

The coated film was etched (etching conditions are: acceleration voltage: 500 V, current: 600 mA, deceleration voltage: 200 V, gas seed: argon 255 CCM and carrier speed: 5 mm/second) by an ion milling method, and then the resist was peeled off using a resist peeling solution (1112A, produced by Shipley Company) to obtain an objective pattern. Using a simultaneously-formed platinum film pattern having a size of 1 cm×1 cm, the sheet resistance was measured, and it was found to be 5.5 Ω/□.

Using EPMA (electron probe-microanalyzer), the substrate manufactured above was subjected to measurement of the Pt amount on the substrate.

The results thereof are shown in Table 1.

TABLE 1

| No. | Sheet resistance (Ω/□) | Film thickness (nm) | EPMA | Porosity | Density | Remark | Density |
|---|---|---|---|---|---|---|---|
| Comparative example | 5.5 | 45 | 2500 | 0.00 | 1.00 | Litho | ref |
| 1 | 60 | 20 | 500 | 0.55 | 0.45 | Pt-Pb | Dense |
| 2 | 40 | 25 | 580 | 0.58 | 0.42 | Pt | Dense |
| 3 | 55 | 30 | 770 | 0.54 | 0.46 | Pt-Pb | Dense |
| 6 | 80 | 30 | 400 | 0.76 | 0.24 | Pt | Non-dense |
| 7 | 120 | 40 | 700 | 0.69 | 0.32 | Pt-Pb | Non-dense |
| 7-2 | 12 | 42 | 820 | 0.65 | 0.35 | Pt-Ru | Non-dense |
| 7-3 | 80 | 56 | 650 | 0.79 | 0.21 | Pt-Sn | Non-dense |
| 7-4 | 64 | 38 | 700 | 0.67 | 0.33 | Pt-V | Non-dense |
| 8 | 160 | 60 | 800 | 0.76 | 0.24 | Pt-Pb | Non-dense |
| 8-2 | 250 | 44 | 420 | 0.83 | 0.17 | Pt-Zn | Non-dense |
| 8-3 | 190 | 51 | 800 | 0.72 | 0.28 | Pt-Rh | Non-dense |
| 8-4 | 99 | 43 | 750 | 0.69 | 0.31 | Pt-Cr | Non-dense |
| 9 | 39 | 60 | 2000 | 0.40 | 0.60 | Pt-Pb | Dense |
| 9-2 | 66 | 32 | 1450 | 0.18 | 0.82 | Pt-Bi | Dense |
| 9-3 | 108 | 78 | 3500 | 0.19 | 0.81 | Pt-Si | Dense |
| 10 | 20 | 40 | 1500 | 0.33 | 0.68 | Pt | Dense |
| 11 | 14 | 60 | 2600 | 0.22 | 0.78 | Pt | Dense |
| 12 | 9 | 76 | 2900 | 0.31 | 0.69 | Pt | Dense |
| 13 | 35 | 42 | 1250 | 0.46 | 0.54 | Pt | Dense |
| 14 | 100 | 25 | 350 | 0.75 | 0.25 | Pt | Non-dense |

Further, masking was performed on a part of the electrodes of the substrate manufactured in Comparative Example and the above-described some Examples, and Ag was deposited thereon at a thickness of 500 nm by sputtering.

This substrate was burned at 400° C. for 1 hour in a circulating hot air oven.

Using EPMA, this substrate was measured on the Ag value at a position of 500 μm from the edge portion generated by sputtering Ag on the Pt electrode.

The results thereof are shown in Table 2.

TABLE 2

| No. | Porosity | Ag | Judgment of Diffusion | Resistance Stability | manufacturing Cost | Overall Judgement |
|---|---|---|---|---|---|---|
| Comparative example | 0 | 1000 | X | ○ | X | X |
| Example 1 | 0.55 | 200 | ○ | ○ | ○ | ⊚ |
| Example 2 | 0.58 | 180 | ○ | ○ | ○ | ⊚ |
| Example 6 | 0.76 | 110 | ○ | X | ○ | Δ |
| Example 7 | 0.69 | 140 | ○ | X | ○ | Δ |
| Example 8 | 0.76 | 140 | ○ | X | ○ | Δ |
| Example 9 | 0.40 | 250 | ○ | ○ | ○ | ⊚ |
| Example 9-2 | 0.18 | 490 | Δ | ○ | ○ | ○ |
| Example 10 | 0.33 | 320 | ○ | ○ | ○ | ⊚ |
| Example 11 | 0.22 | 400 | ○ | ○ | ○ | ⊚ |
| Example 13 | 0.46 | 240 | ○ | ○ | ○ | ⊚ |

Note:
⊚ indicates Excellent,
○ indicates Good,
Δ indicates Available, and
X indicates Inferior Example 15

Using the same method as in Example 4, a plurality of surface conductive-type electron emitting devices were manufactured and, at the same time, a wiring for driving this plurality of surface conductive-type electron-emitting devices was formed to thereby manufacture an electron source and moreover, an image-forming apparatus was manufactured using this electron source. Here, a pair of device electrodes was prepared so as to have a shape that the distance from the contact portion of the device electrodes with the wiring to an electron-emitting portion was 500 μm.

Note that, a pair of device electrodes was manufactured using the following Examples and Comparative Examples of the present invention. Comparative Examples 2 and 3 are examples in which the film thickness of the resin pattern and the dipping time of the resin pattern to a metal solution in Example 9-2 were desirably controlled and a pattern having a different porosity is obtained, for comparing the relation between the porosity and the electron emitting properties.

In this way, a display panel as shown in FIG. 2 was manufactured, and then a drive circuit comprising a scan circuit, a control circuit, a modulation circuit, a d.c. voltage source and the like (all are not shown) was connected thereto to manufacture a panel-form image-forming apparatus.

A predetermined voltage was applied by time sharing to each surface conductive-type electron emitting device through the X-direction terminals $D_{X1}$ to $D_{Xn}$ and the Y-direction terminals $D_{Y1}$ to $D_{Ym}$, and a high voltage was applied to the metal back 9 through the high voltage terminal 12, whereby an image pattern was displayed.

The results thereof were shown in Table 3.

TABLE 3

| No. | Porosity | Ag | Comparison of Electron-Emitting Properties |
|---|---|---|---|
| Comparative example | 0 | 1000 | 0.5 |
| Comparative example 2 | 0.08 | 800 | 0.76 |
| Comparative example 3 | 0.1 | 750 | 0.83 |
| Example 1 | 0.55 | 200 | 1 |
| Example 2 | 0.58 | 180 | 0.98 |
| Example 6 | 0.76 | 110 | 0.99 |
| Example 7 | 0.69 | 140 | 1 |
| Example 8 | 0.76 | 140 | 1 |
| Example 9 | 0.40 | 250 | 0.98 |
| Example 9-2 | 0.18 | 490 | 0.87 |
| Example 10 | 0.33 | 320 | 0.98 |
| Example 11 | 0.22 | 400 | 0.93 |
| Example 13 | 0.46 | 240 | 1 |

As described above, in order to obtain a preferable electron emitting property in the relation between the electron emitting properties and the porosity, it can be said that the porosity is preferably 10% or more, more preferably 20% or more. Taking account of the above-described stability of the resistance, it is preferable to satisfy the porosity of 60% or less. Also, as an electrode pattern, it can be said that, in view of Ag diffusion, the porosity is preferably 10% or more, more preferably 20% or more, and in view of the resistance stability, the porosity is preferably 60% or less.

Example 16

In this Example and Example 17, a resin pattern was formed using a resin having an ion exchange function. More specifically, a resin having a carboxylic acid group was used. As a result, the absorption of metal materials was more improved, and a manufacturing method at a low cost in which the use efficiency of materials is enhanced can be provided. Example 16 will be described in detail below. In this Example, a photosensitive resin containing polymer components (methacrylic acid-methylmethacrylic acid-ethylacrylate-n-butylacrylate-azobisisobutyronitrile copolymer) as described in Patent Registration NO. 02527271 was coated over the entire surface of a glass substrate (75 mm in length× 75 mm in width×2.8 mm in thickness) with a roll coater and dried at 45° C. for 2 minutes using a hot plate. Subsequently, using a negative photomask, the substrate and the mask were contacted with each other, and an exposure was performed thereon for 2 seconds in exposing time by an extra-high pressure mercury lamp (illuminance: 8.0 mW/cm$^2$) as a light source. Thereafter, the resulting substrate was processed by dipping for 30 seconds in pure water as a developing solution to obtain an objective resin pattern. The film thickness of the resin pattern obtained was 1.35 μm.

This resin pattern-formed substrate was dipped in pure water for 30 seconds and then dipped in a Pt—Pb solution (platinum (II) monoethanolamine acetate complex: platinum content: 2% by weight/lead (II) acetate: lead content: 200 ppm)) for 60 seconds.

Subsequently, the substrate was taken out from the Pt—Pb solution, washed with a flowing water for 5 seconds to wash the Pt complex solution between the resin patterns, dewatered by spraying thereon air and dried for 3 minutes by a hot plate at 80° C.

Thereafter, the substrate dried was burned at 500° C. for 30 minutes in a circulating hot air oven to form a platinum electrode having a distance between electrodes of 20 µm, a width of 60 µm, a length of 120 µm and a thickness of 15 nm.

The sheet resistance of this electrode was 80 Ω/□.

Example 17

Using the resin pattern manufactured in Example 16, instead of dipping it in the Pt—Pb solution, the solution was imparted two times on the resin pattern by an ink jet apparatus (Bubble Jet Printer Head BC-01, manufactured by Canon Co., Inc.) and dried for 3 minutes by a hot plate at 80° C.

Thereafter, the substrate dried was burned at 500° C. for 30 minutes in a circulating hot air oven to form a platinum electrode having a distance between electrodes of 20 µm, a width of 60 µm, a length of 120 µm and a thickness of 15 nm. In case of this Example, the washing step is not required, and therefore the number of steps can be reduced.

Also, the sheet resistance of this electrode was 85 Ω/□.

In Examples 16 and 17 above, also, a pattern was able to be formed with a good use efficiency of materials. Further, the electrode patterns manufactured according to the methods of Examples 16 and 17 above are used for the device electrode of the image-forming apparatus in Example 4. As a result, preferable electron emitting properties was able to be obtained and a preferable image display was able to be realized.

The present invention is as described above, and exhibits the following effects.

(1) The materials constituting a pattern are scarcely removed in the course of the process for forming the metal or the metal compound pattern, and therefore, for example, at the formation of an electrically conductive pattern such as an electrode or a wiring, electrically conductive pattern constituting materials that are to be removed during the process can be suppressed to the minimum, and even when the electrically conductive pattern is constituted by a noble metal such as platinum, a load bearing at the time of recovering and reusing the electrically conductive pattern constituting materials that are to be removed during the process can be reduced to the minimum. Further, if an electron emitting device, an electron source and an image-forming apparatus are manufactured using this method of forming the electrically conductive pattern, the above-described load at the time of manufacturing those can be greatly reduced.

(2) From the same reason as that described above, since a pattern can be formed using the minimum required amount of metal component, the cost required at the time of forming a large number of electrodes, wiring patterns or insulating layers over a large area can be suppressed.

(3) In the present invention, a water-soluble photosensitive resin is used as a photosensitive resin and a solution containing metal components is prepared as an aqueous solution, whereby an adverse influence exerted on the natural environment in addition to a working environment can be suppressed to the minimum and, at the same time, a patterning does not require the use of a strong acid, with the result that there is no fear that the precision decreases due to the corrosion of the substrate due to a strong acid, and a desired fine electrically conductive pattern can be formed without lowering the precision.

(4) In particular, by selecting such a metal organic compound (a metal complex having a specified ligand) that a crystal is hardly precipitated in the drying step, a metal film formed as an electrically conductive pattern can be rendered an uniform with good quality.

Further, an embodiment mode in which the porosity is controlled exhibits the following effects.

(5) If a film quality of a metal or a metal compound pattern is controlled, the use ratio of materials is reduced while maintaining the electrical properties as a pattern, such as the resistance in the case of using it as an electrode or the insulating property in the case of using it as an insulating layer, as a result, whereby the cost can be reduced.

(6) The diffusion and movement of the dissimilar metal can be greatly suppressed in the presence of dissimilar metal.

(7) In particular, when the pattern is used for an electrode constituting an electron emitting device, the deterioration of electron emitting properties due to diffusion of dissimilar metals can be prevented and a preferable image-forming apparatus can be provided.

What is claimed is:

1. A method of manufacturing a metal or a metal compound pattern, comprising:
    a coating step of coating a photosensitive resin of negative-type on a surface of a substrate, the resin having water soluble and ion-exchangeable characteristics;
    an exposing step of exposing the coated photosensitive resin to a light with a mask;
    a removing step of removing a light-unexposed portion of the coated photosensitive resin and maintaining a light-exposed portion which forms a resin pattern corresponding to the metal or metal compound pattern by developing the photosensitive resin subjected to the exposing step with a developing water solution;
    subsequent to the removing step, an absorbing step of making the resin pattern absorb a water solution containing metal components; and
    a burning step of burning the resin pattern that has absorbed the solution containing metal components, to remove a resin component therefrom and maintain the patterned metal components which become the metal or metal compound pattern thereon,
    wherein performance of said absorbing step makes the resin pattern absorb an amount of the water solution containing metal components sufficient to form the metal or metal compound pattern to have a thickness of at least 15 nm to about 78 nm.

2. The method of manufacturing a metal or metal compound pattern according to claim 1, further comprising
    a washing step of washing the substrate having formed thereon the resin pattern that has absorbed the solution containing metal components, the washing step being conducted after the absorbing step and before the burning step.

3. The method of manufacturing a metal or metal compound pattern according to claim 1, wherein the resin has a carboxylic acid group.

4. The method of manufacturing a metal or metal compound pattern according to claim 1, wherein the solution containing metal components is an aqueous solution obtained by dissolving a water-soluble metal organic compound in an aqueous solvent component.

5. The method of manufacturing a metal or metal compound pattern according to claim 4, wherein the metal components are mainly a platinum complex.

6. The method of manufacturing a metal or metal compound pattern as claimed in claim 1 or 2, wherein as the metal components, at least any one of elemental forms of rhodium, bismuth, ruthenium, vanadium, chromium, tin, lead and silicon or a compound thereof is contained.

7. A method of manufacturing an electron source provided with a plurality of electron-emitting devices having an electrode, wherein the electrode is manufactured by a method comprising:

a coating step of coating a photosensitive resin of negative-type on a surface of a substrate, the resin having water soluble and ion-exchangeable characteristics;

an exposing step of exposing the coated photosensitive resin to a light with a mask;

a removing step of removing a light-unexposed portion of the coated photosensitive resin and maintaining a light-exposed portion which forms a resin pattern corresponding to the metal or metal compound pattern by developing the photosensitive resin subjected to the exposing step with a developing water solution;

subsequent to the removing step, an absorbing step of making the resin pattern absorb a water solution containing metal components; and a burning step of burning the resin pattern that has absorbed the solution containing metal components, to remove a resin component therefrom and maintain patterned metal components thereon which become the electrode, wherein performance of said absorbing step makes the resin pattern absorb an amount of the water solution containing metal components sufficient to form the electrode to have a thickness of at least 15 nm to about 78 nm.

* * * * *